(12) United States Patent
Peng et al.

(10) Patent No.: US 12,051,691 B2
(45) Date of Patent: Jul. 30, 2024

(54) PLANAR AND NON-PLANAR FET-BASED ELECTROSTATIC DISCHARGE PROTECTION DEVICES

(71) Applicant: TAIWAN SEMICONDUCTOR MANUFACTURING CO., LTD., Hsinchu (TW)

(72) Inventors: Po-Lin Peng, Hsinchu (TW); Han-Jen Yang, Taipei (TW); Jam-Wem Lee, Hsinchu (TW); Li-Wei Chu, Taipei (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 470 days.

(21) Appl. No.: 17/020,507

(22) Filed: Sep. 14, 2020

(65) Prior Publication Data

US 2020/0411506 A1    Dec. 31, 2020

Related U.S. Application Data

(63) Continuation of application No. 15/393,723, filed on Dec. 29, 2016, now Pat. No. 10,777,546.

(Continued)

(51) Int. Cl.
*H01L 27/02* (2006.01)
*H01L 23/528* (2006.01)
(Continued)

(52) U.S. Cl.
CPC ...... *H01L 27/0277* (2013.01); *H01L 23/5286* (2013.01); *H01L 27/0722* (2013.01);
(Continued)

(58) Field of Classification Search
CPC ............ H01L 27/0277; H01L 27/0722; H01L 29/1083; H01L 29/0649; H01L 23/5286;
(Continued)

(56) References Cited

U.S. PATENT DOCUMENTS 6,236,073 B1 * 5/2001 Hsu ...................... H01L 27/0266
257/365
6,465,768 B1  10/2002 Ker et al.
(Continued)

FOREIGN PATENT DOCUMENTS

CN          1402358 A    3/2003
KR     2002-0067379 A    8/2002
(Continued)

*Primary Examiner* — Dale E Page
*Assistant Examiner* — Quovaunda Jefferson
(74) *Attorney, Agent, or Firm* — Sterne, Kessler, Goldstein & Fox P.L.L.C.

(57) ABSTRACT

An electrostatic discharge (ESD) protection device having a source region coupled to a first electrical node, a first drain region coupled to a second electrical node different from the first electrical node, and an extended drain region between the source region and the first drain region. The extended drain region includes a number N of electrically floating doped regions and a number M of gate regions coupled to the second electrical node, where N and M are integers greater than 1 and N is equal to M. Each electrically floating doped region of the N number of floating doped regions alternates with each gate region of the M number of gate regions.

20 Claims, 14 Drawing Sheets

Related U.S. Application Data

(60) Provisional application No. 62/428,208, filed on Nov. 30, 2016.

(51) Int. Cl.
*H01L 27/07* (2006.01)
*H01L 29/06* (2006.01)
*H01L 29/10* (2006.01)
*H01L 29/861* (2006.01)

(52) U.S. Cl.
CPC ...... *H01L 29/0649* (2013.01); *H01L 29/1083* (2013.01); *H01L 29/861* (2013.01)

(58) Field of Classification Search
CPC ............ H01L 27/0617; H01L 27/0928; H01L 27/0251; H01L 27/0292; H01L 27/0266; H01L 29/861; H01L 21/823892
See application file for complete search history.

(56) References Cited

U.S. PATENT DOCUMENTS

| | | | |
|---|---|---|---|
| 6,492,208 B1 * | 12/2002 | Cheng | H01L 27/0262 257/355 |
| 6,573,568 B2 * | 6/2003 | Lin | H01L 27/027 257/365 |
| 6,864,536 B2 | 3/2005 | Lin et al. | |
| 6,903,913 B2 | 6/2005 | Ker et al. | |
| 7,009,252 B2 | 3/2006 | Lin et al. | |
| 7,256,461 B2 * | 8/2007 | Lin | H01L 27/0266 257/361 |
| 7,436,042 B2 | 10/2008 | Ker et al. | |
| 7,594,198 B2 | 9/2009 | Chen | |
| 8,324,658 B2 | 12/2012 | Tsai et al. | |
| 8,334,571 B2 | 12/2012 | Tsai et al. | |
| 8,390,070 B2 | 3/2013 | Chen | |
| 8,541,848 B2 | 9/2013 | Huang et al. | |
| 8,730,626 B2 | 5/2014 | Tseng et al. | |
| 8,743,515 B2 | 6/2014 | Yang et al. | |
| 8,759,871 B2 | 6/2014 | Song et al. | |
| 8,760,828 B2 | 6/2014 | Ma | |
| 8,792,218 B2 | 7/2014 | Tsai | |
| 8,854,778 B2 | 10/2014 | Chu et al. | |
| 8,867,183 B2 | 10/2014 | Chen et al. | |
| 9,035,393 B2 | 5/2015 | Ma et al. | |
| 9,048,098 B2 | 6/2015 | Chen et al. | |
| 9,048,655 B2 | 6/2015 | Meng et al. | |
| 9,069,924 B2 | 6/2015 | Chen | |
| 9,117,677 B2 | 8/2015 | Ma et al. | |
| 9,184,586 B2 | 11/2015 | Wang et al. | |
| 9,214,540 B2 | 12/2015 | Tsai et al. | |
| 10,026,727 B2 | 7/2018 | Lin et al. | |
| 10,777,546 B2 * | 9/2020 | Peng | H01L 29/1083 |
| 2005/0242399 A1 | 11/2005 | Huang | |
| 2005/0280091 A1 * | 12/2005 | Huang | H01L 29/0619 257/362 |
| 2013/0119433 A1 | 5/2013 | Wang | |
| 2014/0139957 A1 | 5/2014 | Stockinger | |
| 2014/0175611 A1 | 6/2014 | Hsu | |
| 2014/0217461 A1 | 8/2014 | Song et al. | |
| 2014/0226241 A1 | 8/2014 | Tseng et al. | |
| 2014/0307355 A1 | 10/2014 | Tsai et al. | |
| 2015/0311342 A1 | 10/2015 | Lin et al. | |
| 2015/0348967 A1 | 12/2015 | Lee et al. | |

FOREIGN PATENT DOCUMENTS

| | | |
|---|---|---|
| KR | 10-1289919 | 7/2013 |
| TW | 501263 | 9/2002 |
| TW | 510040 | 11/2002 |
| TW | 550778 B | 9/2003 |
| TW | 200522331 A | 7/2005 |
| TW | 201242010 A | 10/2012 |
| TW | 201320291 A | 5/2013 |
| TW | 201322424 A | 6/2013 |
| TW | 201334153 A | 8/2013 |
| TW | 201614801 A | 4/2016 |

\* cited by examiner

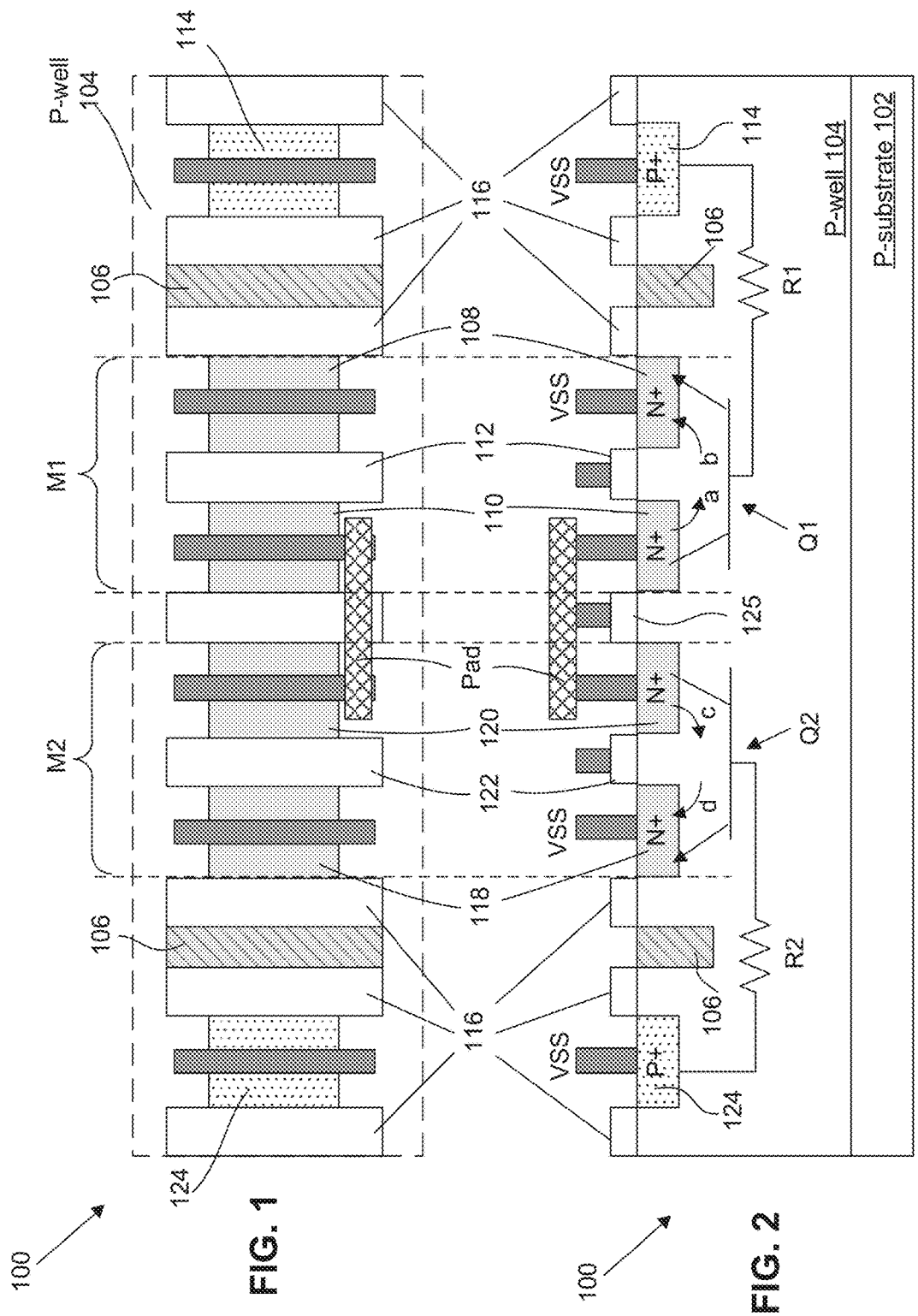

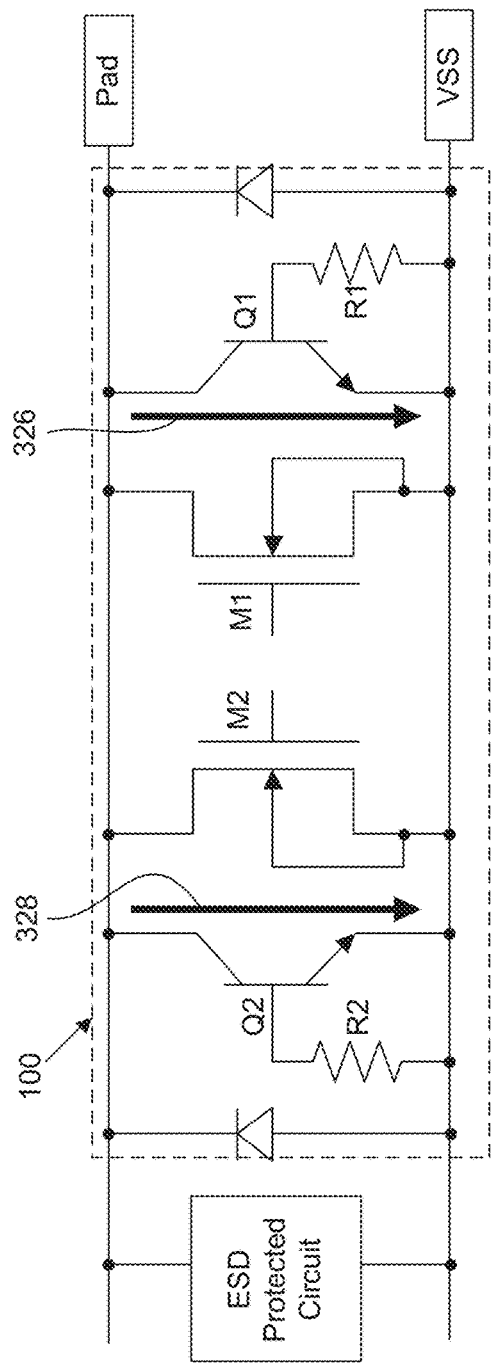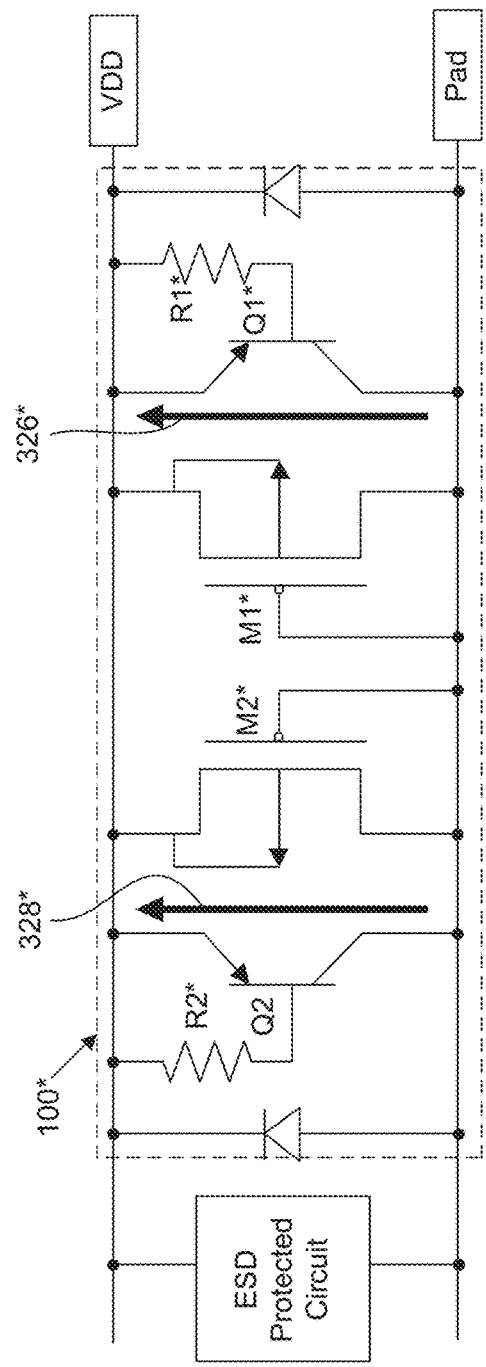
FIG. 3
FIG. 4

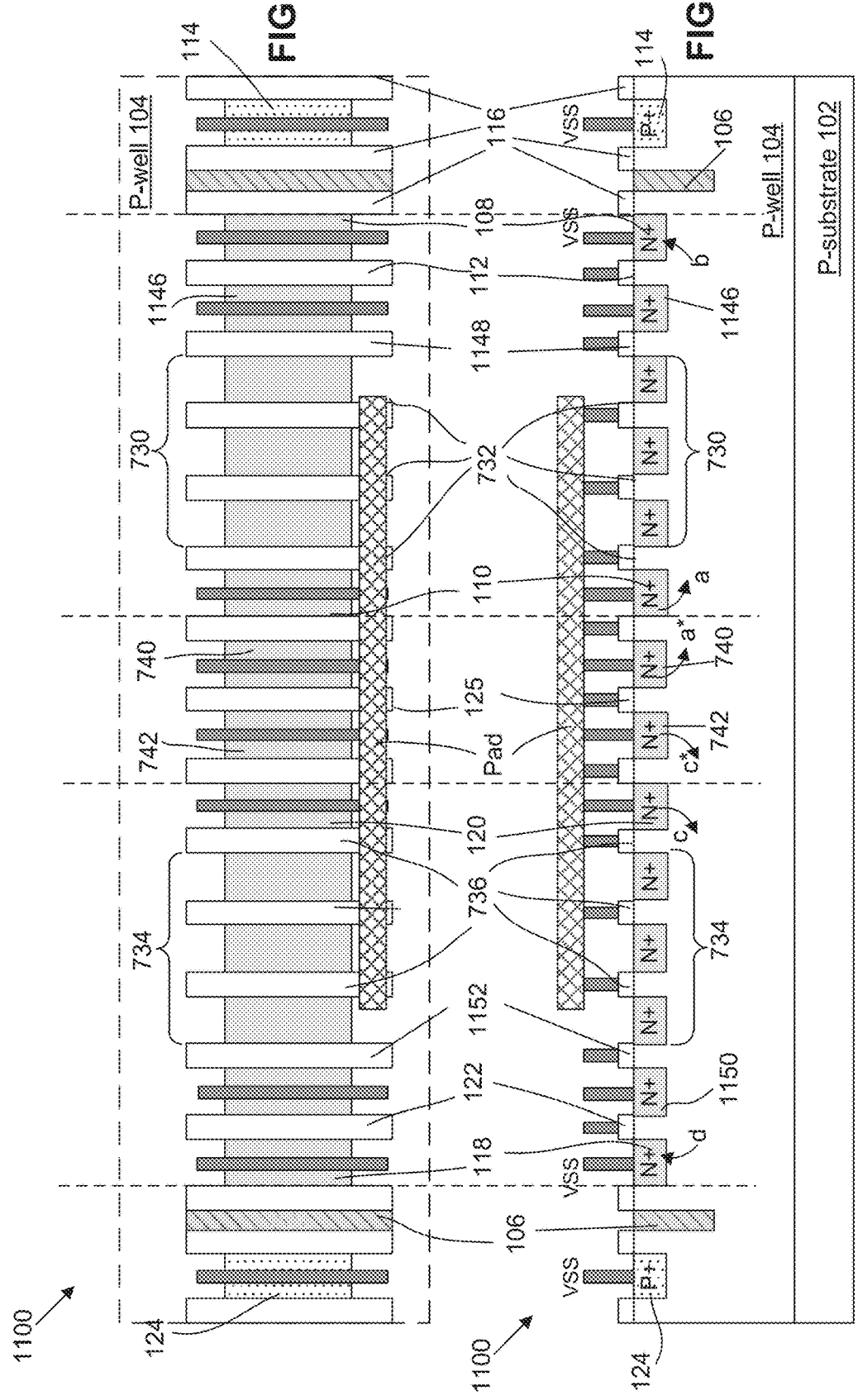

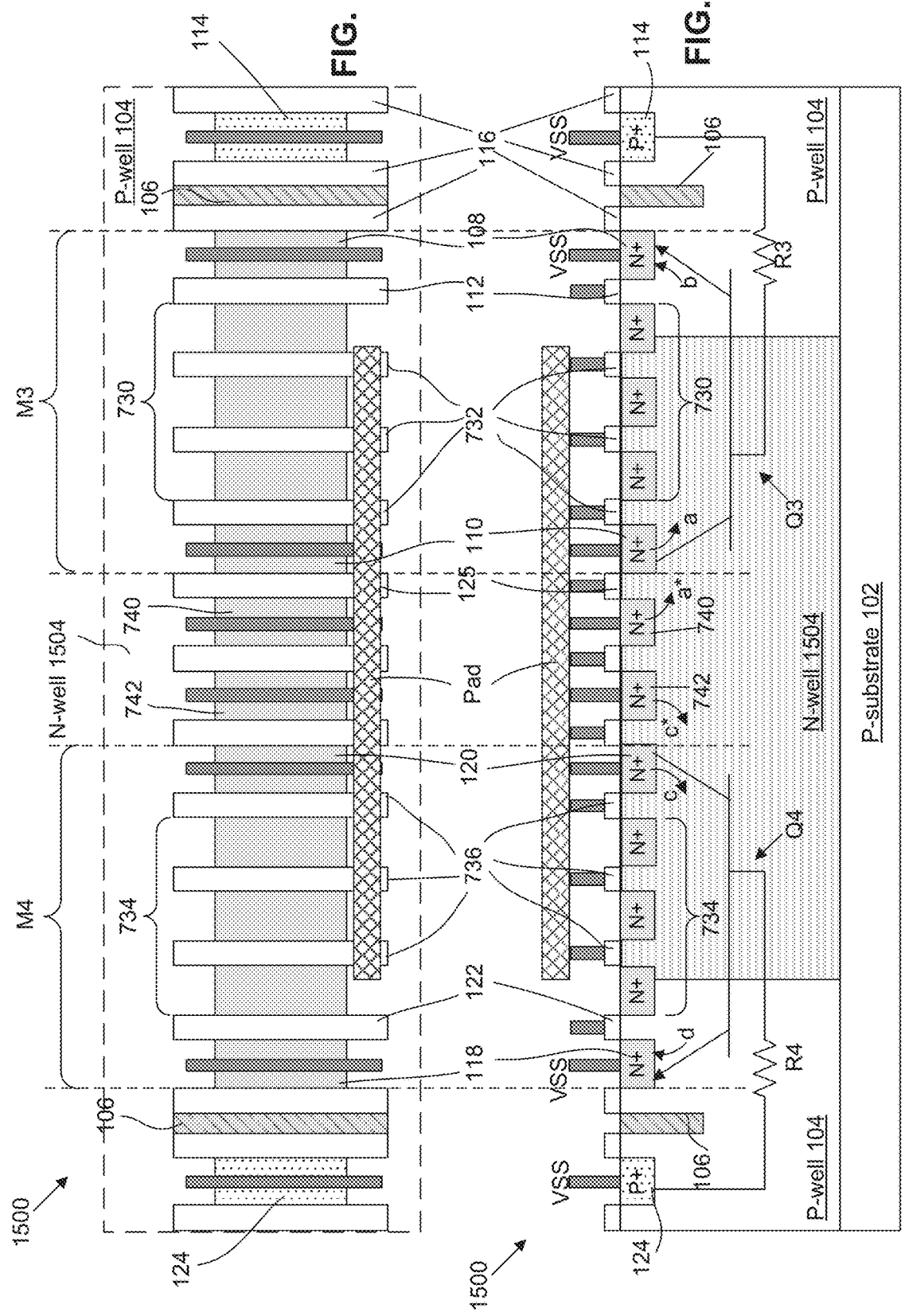

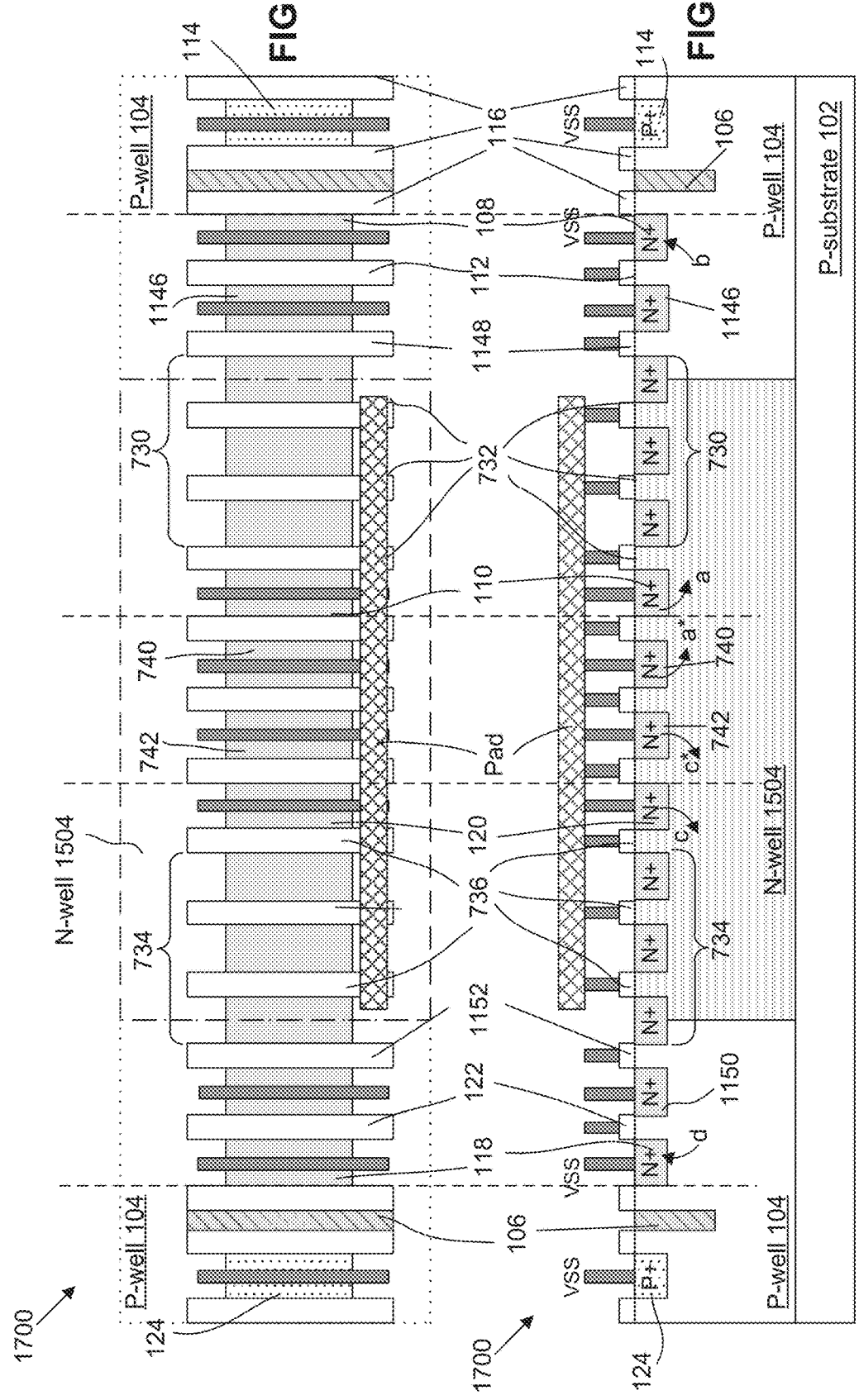

PLANAR AND NON-PLANAR FET-BASED ELECTROSTATIC DISCHARGE PROTECTION DEVICES

CROSS-REFERENCE TO RELATED APPLICATION

This application is a continuation of U.S. Non-Provisional patent application Ser. No. 15/393,723, filed on Dec. 29, 2016 and titled "Planar and Non-Planar FET-based Electrostatic Discharge Protection Devices," which claims the benefit of U.S. Provisional Patent Application No. 62/428,208, filed on Nov. 30, 2016 and titled "Planar and Non-Planar FET-based Electrostatic Discharge Protection Devices." The entire contents of both applications are incorporated by reference herein in their entireties.

BACKGROUND

This disclosure generally relates to electrostatic discharge protection devices of integrated circuits (ICs).

Electrostatic discharge (ESD) events can cause serious damage to electronic components including ICs. During an ESD event, a large amount of heat is generated in a small area requiring its rapid removal to prevent any harm to the IC. An ESD event is an instantaneous build up of a substantial electrical potential, generally caused by direct or indirect contact with an electrostatic field. An ESD event that is harmful to an IC can be caused by various factors including contact with a human or machine such as testing equipment or other electrical components that are not properly grounded. ESD protection devices are incorporated into various electronic devices in order to prevent or reduce damage to ICs.

The trend towards smaller and faster circuits have increased an integrated circuit's susceptibility to ESD events and the complexity of designing effective ESD protection devices.

BRIEF DESCRIPTION OF THE DRAWINGS

Aspects of this disclosure are best understood from the following detailed description when read with the accompanying figures. It is noted that, in accordance with the common practice in the industry, various features are not drawn to scale. In fact, the dimensions of the various features may be arbitrarily increased or reduced for clarity of discussion.

FIGS. 1-2 are plan and cross-sectional views of an exemplary ESD protection device.

FIG. 3 is an equivalent circuit diagram of the exemplary ESD protection device of FIGS. 1-2.

FIG. 4 is a circuit diagram of an exemplary PMOS-based ESD protection device.

FIGS. 11-12 are plan and cross-sectional views of an exemplary drain-extended stacked NMOS-based ESD protection device.

FIGS. 15-16 are plan and cross-sectional views of an exemplary drain extended NMOS ESD protection device.

FIGS. 17-18 are plan and cross-sectional views of an exemplary drain extended stacked NMOS ESD protection device.

Illustrative embodiments will now be described with reference to the accompanying drawings. In the drawings, like reference numerals generally indicate identical, functionally similar, and/or structurally similar elements.

DETAILED DESCRIPTION

Figure 5:
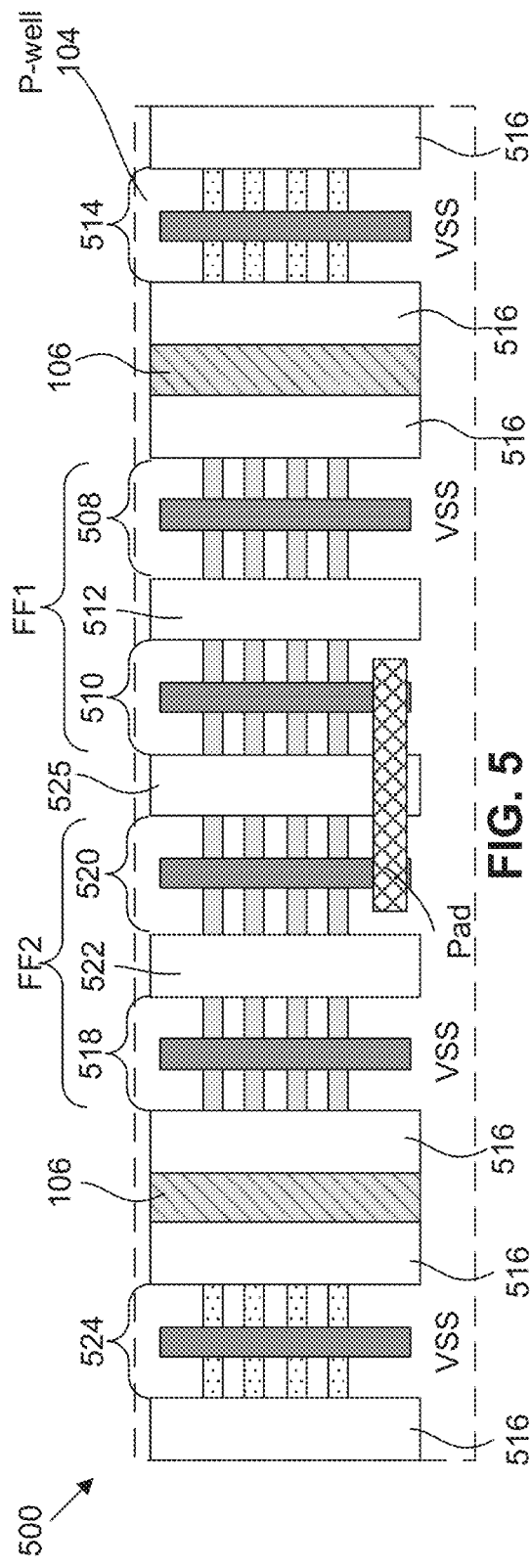
FIGS. 5-6 are plan views of exemplary finFET-based ESD protection devices.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over a second feature in the description that follows may include embodiments in which the first and second features are formed in direct contact, and may also include embodiments in which additional features may be formed between the first and second features, such that the first and second features may not be in direct contact. As used herein, the formation of a first feature on a second feature means the first feature is formed in direct contact with the second feature. In addition, the present disclosure may repeat reference numerals and/or letters in the various examples. This repetition does not in itself dictate a relationship between the various embodiments and/or configurations discussed.

Spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It is noted that references in the specification to "one embodiment," "an embodiment," "an example embodiment," "exemplary," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of one skilled in the art to effect such feature, structure or characteristic in connection with other embodiments whether or not explicitly described.

It is to be understood that the phraseology or terminology herein is for the purpose of description and not of limitation, such that the terminology or phraseology of the present specification is to be interpreted by those skilled in relevant art(s) in light of the teachings herein.

The term "about" as used herein indicates the value of a given quantity varies by ±10% of the value, unless noted otherwise.

As used herein, the term "substrate" describes a material onto which subsequent material layers are added. The substrate itself may be patterned, and materials added on top of it may also be patterned, or may remain without patterning. Furthermore, "substrate" may be any of a wide array of semiconductor materials such as silicon, germanium, gallium arsenide, indium phosphide, etc. Alternatively, the substrate may be electrically non-conductive such as a glass or sapphire wafer.

As used herein, the term "vertical" means nominally perpendicular to the surface of a substrate.

The P-wells disclosed herein may be formed by doping a substrate with p-type dopants, unless mentioned otherwise.

The N-wells disclosed herein may be formed by doping a substrate with n-type dopants, unless mentioned otherwise.

Overview

This disclosure provides various exemplary configurations of planar and non-planar FET-based ESD protection devices with improved performance compared to current FET-based ESD protection devices. For example, the ESD protection devices disclosed herein provide higher turn-on uniformity, higher driving current, larger volume for faster heat dissipation during an ESD event, and lower leakage current during the off-state of the ESD protection devices compared to current ESD devices. In addition, finFET-based ESD devices disclosed herein include extended drain regions that meet the minimum poly-to-poly spacing requirement of the restrictive design rules (RDRs) in semiconductor manufacturing technology.

Exemplary ESD Protection Devices

FIG. 1 is a plan view of an exemplary n-channel metal-oxide-semiconductor (NMOS)-based ESD protection device 100 in an IC. FIG. 2 is a cross-sectional view of ESD protection device 100 of FIG. 1.

ESD protection device 100 includes a P-well 104 on a p-type substrate 102, shallow trench isolation (STI) regions 106, NMOS transistors M1 and M2 connected in parallel with each other, parasitic NPN transistors Q1 and Q2, and parasitic resistances R1 and R2. Transistor M1 includes N+ doped regions 108 and 110 formed in P-well 104 and a gate 112 formed on P-well 104. In some embodiments, P-well 104 is optional and N+ doped regions 108 and 110 are formed in P-substrate 102. N+ doped region 108 may be configured as a source region and coupled to power rail VSS and N+ doped region 110 may be configured as a drain region and coupled to a pad of the IC. In some embodiments, the pad of the IC is a bonding pad that is attached to one or more I/O pads or pins of an ESD protected circuit. Gate 112 may be coupled to a voltage source or the power rail VSS. In some embodiments, the power rail VSS is at a ground potential.

Parasitic NPN transistor Q1 includes N+ doped region 110 as collector, P-well 104 as base, and N+ doped region 108 as emitter. The base of NPN transistor Q1 is coupled to a P+ doped region 114 through parasitic resistor R1, which represents the intrinsic resistance of P-well 104, or P-substrate 102 when M1 is formed in P-substrate 102. P+ doped region 114 may be coupled to the power rail VSS. ESD protection device 100 further includes dummy gates 116, which are electrically isolated.

Transistors M2, Q2, and resistor R2 may be similar in structure and function to transistors M1. Q1, and resistor R1, respectively, and may form a mirror image of the arrangement transistors M1, Q1, and resistor R1. Transistor M2 includes N+ doped regions 118 and 120 formed in P-well 104 and a gate 122 formed on P-well 104. N+ doped region 118 may be configured as a source region and coupled to the power rail VSS and N+ doped region 120 may be configured as a drain region and coupled to the pad of the IC. Gate 122 may be coupled to a voltage source or the power rail VSS. Parasitic NPN transistor Q2 includes N+ doped region 120 as collector, P-well 104 as base, and N+ doped region 118 as emitter. The base of NPN transistor Q2 is coupled to a P+ doped region 124 through parasitic resistor R2, which represents the intrinsic resistance of P-well 104, or P-substrate 102 when M2 is formed in P-substrate 102. P+ doped region 124 may be coupled to the power rail VSS. In some embodiments, transistors M1 and M2 are spaced apart by a gate 125 that is coupled at the same potential as N+ doped regions 110 and 120 (e.g., the potential of the pad).

The arrangement of transistors M1, M2, Q1, Q2, and resistors R1 and R2 along with STI regions 106, P+ doped regions 114, 124, and dummy gates 116 may be repeated as many times as needed depending on the current capabilities desired for ESD protection device 100. It is noted that ESD protection device 100 may be based on a single arrangement of transistors M1, Q1, and resistor R1.

P-substrate 102 and p-well 104 include a semiconductor material such as, but not limited to, silicon, germanium, a compound semiconductor including silicon carbide, gallium arsenide, gallium phosphide, indium phosphide, indium arsenide, indium antimonide, an alloy including silicon germanium carbide, silicon germanium, gallium arsenic phosphide, gallium indium phosphide, gallium indium arsenide, gallium indium arsenic phosphide, aluminum indium arsenide, aluminum gallium arsenide, or a combination thereof. Further, p-substrate 102 and p-well 104 are doped with p-type dopants, such as boron, indium, aluminum, or gallium. In some embodiments, p-substrate 102 may include material and dopant concentration that are similar to or different from the material and dopant concentration of p-well 104. STI regions 106 are made of dielectric material. In some embodiments, STI regions 106 include silicon oxide, silicon nitride, silicon oxynitride, fluorine-doped silicate glass (FSG), a low-k dielectric material, and/or other suitable insulating material. N+ doped regions 108, 110, 118, and 120 may be doped with n-type dopants, such as phosphorus, arsenic, or a combination thereof and may have a dopant concentration greater than $1\times10^{19}$ atoms/cm$^3$. P+ doped regions 114 and 124 may be doped with p-type dopants such as boron, indium, aluminum, gallium, or a combination thereof and may have a dopant concentration greater than $1\times10^{19}$ atoms/cm$^3$.

Each of gates 112 and 122 includes a gate electrode and a dielectric layer (not shown). In some embodiments, dielectric layer includes one or more layers of silicon oxide, silicon nitride, silicon oxynitride, or high-k dielectric materials such as hafnium oxide ($HfO_2$), $TiO_2$, HfZrO, $Ta_2O_3$, $HfSiO_4$, $ZrO_2$, $ZrSiO_2$, or a combination thereof. Alternatively, high-k dielectric materials may comprise metal oxides. Examples of metal oxides used for high-k dielectrics include oxides of Li, Be, Mg, Ca, Sr, Sc, Y, Zr, Al, La, Ce, Pr, Nd, Sm, Eu, Gd, Tb, Dy, Ho, Er, Tm, Yb, Lu, and/or mixtures thereof. The dielectric layer may be formed by chemical vapor deposition (CVD), atomic layer deposition (ALD), physical vapor deposition (PVD), e-beam evaporation, or other suitable process.

The gate electrode may include a gate work function metal layer and a gate metal fill layer. In some embodiments, the gate work function metal layer includes any suitable material, such as aluminum (Al), copper (Cu), tungsten (W), titanium (Ti), tantalum (Ta), titanium nitride (TiN), tantalum nitride (TaN), nickel silicide (NiSi), cobalt silicide (CoSi), silver (Ag), tantalum carbide (TaC), tantalum silicon nitride (TaSiN), tantalum carbon nitride (TaCN), titanium aluminum (TiAl), titanium aluminum nitride (TiAN), tungsten nitride (WN), metal alloys, and/or combinations thereof. The gate work function metal layer may be formed using a suitable process such as ALD, CVD, PVD, plating, or combinations thereof. In some embodiments, the gate metal fill layer includes any suitable conductive material, such as Ti, Ag, Al, TiAlN, TaC, TaCN, TaSiN, Mn, Zr, TiN, TaN, Ru, Mo, WN, Cu, W, Co, Ni, TiC, TiAC, TaAlC, metal alloys, and/or combinations thereof. The gate metal fill layer may be formed by ALD, PVD, CVD, or other suitable conductive material deposition process.

In some embodiments, gate 125 and dummy gates 116 include gate electrode and dielectric layer similar to gates 112 and 122. In some embodiments, gate 125 and/or dummy gates 116 include a polysilicon structure.

FIG. 3 shows an exemplary equivalent circuit diagram of ESD protection device 100 coupled to an ESD protected circuit. NMOS transistors M1 and M2 are connected in parallel with their drain regions and source regions coupled to the pad and the power rail VSS, respectively. NPN transistors Q1 and Q2 are connected in parallel with their collectors and emitters coupled to the pad and the power rail VSS, respectively, and their bases coupled to the power rail VSS through parasitic resistors R1 and R2, respectively.

ESD protection device 100 operates in two modes—on-state and off-state, which are discussed below with reference to FIGS. 1-3. The on-state is during an ESD event, which may be an instantaneous build up of a substantial electrical potential at the pad, generally caused by direct or indirect contact with an electrostatic field. During the ESD event, ESD protection device 100 offers low impedance discharging paths 326 and 328 (FIG. 3) to the ESD charge current to be discharged without damaging the ESD protected circuit. Discharging path 326 is represented in FIGS. 1 and 2 by path a from N+ doped region 110 to P-well 104 and path b from P-well 104 to N+ doped region 108. Similarly, discharging path 328 is represented in FIGS. 1 and 2 by path c from N+ doped region 120 to P-well 104 and path d from P-well 104 to N+ doped region 118.

During the ESD event, path a, which is N+ doped region 110/P-well 104 junction is reverse biased and may induce leakage current and path b, which is P-well 104/N+ doped 108 junction is forward biased. Thus, the parasitic transistor Q1 is turned on and at least part of the ESD charge current flows from the pad to the power rail VSS through path a (FIGS. 1-2), i.e., its equivalent discharging path 326 (FIG. 3) without passing through the ESD protected circuit. Another part of the ESD charge current flows through path b (FIGS. 1-2), i.e., its equivalent discharging path 328 (FIG. 3) when parasitic transistor Q2 is turned on during the ESD event in a manner similar to parasitic transistor Q1.

The off-state is during the normal operation of the ESD protected circuit, i.e., without ESD events. During normal operation, ESD protection device 100 offers a high impedance relative to the ESD protected circuit so as not to affect the flow of current to the ESD protected circuit.

FIG. 4 shows an exemplary circuit diagram of an ESD protection device 100* of an IC coupled to an ESD protected circuit. ESD protection device 100* is similar in arrangement to ESD protection device 100 but it is based on p-type transistors. ESD protection device 100* includes PMOS transistors M1* and M2* connected in parallel with their source regions and drain regions coupled to power rail VDD and a pad of the IC, respectively. PNP transistors Q1* and Q2* are connected in parallel with their collectors and emitters coupled to the power rail VDD and the pad, respectively, and their bases coupled to the power rail VDD through parasitic resistors R1* and R2*, respectively. Parasitic resistors R1* and R2* represent the intrinsic resistance of N-well (not shown) in which transistors Q1* and Q2* are formed. Parasitic PNP transistors Q1* and Q2* include drain regions of transistors M1* and M2* as collectors, N-well formed on a p-substrate as base, and source regions of transistors M1* and M2* as emitters. ESD protection device 100* may operate in a manner similar to ESD protection device 100 but with the polarities reversed. During an ESD event, the ESD charge current is discharged from the power rail VDD to the pad through discharging paths 326* and 328*.

FIG. 5 is plan view of an exemplary ESD protection device 500, which may be similar to ESD protection device 100 in structure and function. The differences between ESD protection devices 100 and 500 are discussed below. ESD protection device 500 is implemented using multi-fin n-type finFETs FF1 and FF2 instead of the planar NMOS transistors M1 and M2 of ESD protection device 100. FinFETs FF1 and FF2 may include one or more fins and are not limited to the four fins shown in FIG. 5. FinFETs FF1 and FF2 are connected in parallel with each other. FinFETs FF1 and FF2 include gates 512 and 522, N+ doped regions 508 and 518 configured as source regions, and N+ doped regions 510 and 520 configured as drain regions, respectively. FinFETs FF1 and FF2 are coupled to the pad and the power rail VSS in a manner similar to transistors M1 and M2 of ESD protection device 100. ESD protection device 500 also includes parasitic NPN transistors formed between N+ doped regions of finFETs FF1 and FF2 and P-well 104 as parasitic NPN transistors Q1 and Q2 of ESD protection device 100. For example, a parasitic transistor is formed with N+ doped region 510 as collector, N+ doped region 508 as emitter, and P-well 104 as base, coupled to a P+ doped region 514 through a parasitic resistor, which represents the intrinsic resistance of P-well 104, or P-substrate 102 when finFET FF1 is formed in P-substrate 102. Similar to ESD protection device 100, the parasitic NPN transistors of ESD protection device provide the discharging paths during an ESD event.

Dummy gates 516 and gate 525 similar in function and material composition to dummy gates 116 and gate 125 are also included in ESD protection device 500. The material composition of N+ doped regions 508, 510, 518, 520, P+ doped regions 514, 524, and gates 512, 522 are similar to that of N+ doped regions 108, 110, 118, 120, P+ doped regions 114, 124, and gates 112, 122, respectively.

N+ doped regions 508, 510, 518, 520 are epitaxial fin regions of finFETs FF1 and FF2, which include semiconductor material epitaxially-grown on P-substrate 102 or P-well 104. The epitaxially-grown semiconductor material may include semiconductor material such as germanium or silicon; or compound semiconductor materials, such as gallium arsenide, aluminum gallium arsenide; or semiconductor alloy, such as silicon germanium, or gallium arsenide phosphide. In some embodiments, epitaxial fin regions of finFETs FF1 and FF2 are grown by CVD, e.g., low pressure CVD (LPCVD), atomic layer CVD (ALCVD), ultrahigh vacuum CVD (UHVCVD), reduced pressure CVD (RPCVD), any suitable CVD; molecular beam epitaxy (MBE) processes; any suitable epitaxial process; or any combinations thereof. In some embodiments, epitaxial fin regions are grown by an epitaxial deposition/partial etch process, which repeats the epitaxial deposition/partial etch process at least once. Such repeated deposition/partial etch process is also called a cyclic deposition-etch (CDE) process. The epitaxial fin regions of finFETs FF1 and FF2 may be in-situ doped during the epitaxial growth process. In various embodiments, epitaxial regions may be doped with n-type dopants, such as phosphorus or arsenic, and/or combinations thereof; using n-type doping precursors, such as, but not limited to, phosphine ($PH_3$), arsine ($AsH_3$), and/or other n-type doping precursor can be used. By using the in-situ doping process, the dopant concentration of the epitaxially-grown semiconductor material can be desirably controlled and achieved. In some embodiments, epitaxial fin regions are not in-situ doped, and an ion implantation process is performed to dope the epitaxial fin regions of finFETs FF1 and FF2. The doping concentration of N+ doped regions 508, 510, 518, 520 may be greater than $1 \times 10^{19}$ atoms/cm$^3$.

Figure 6:
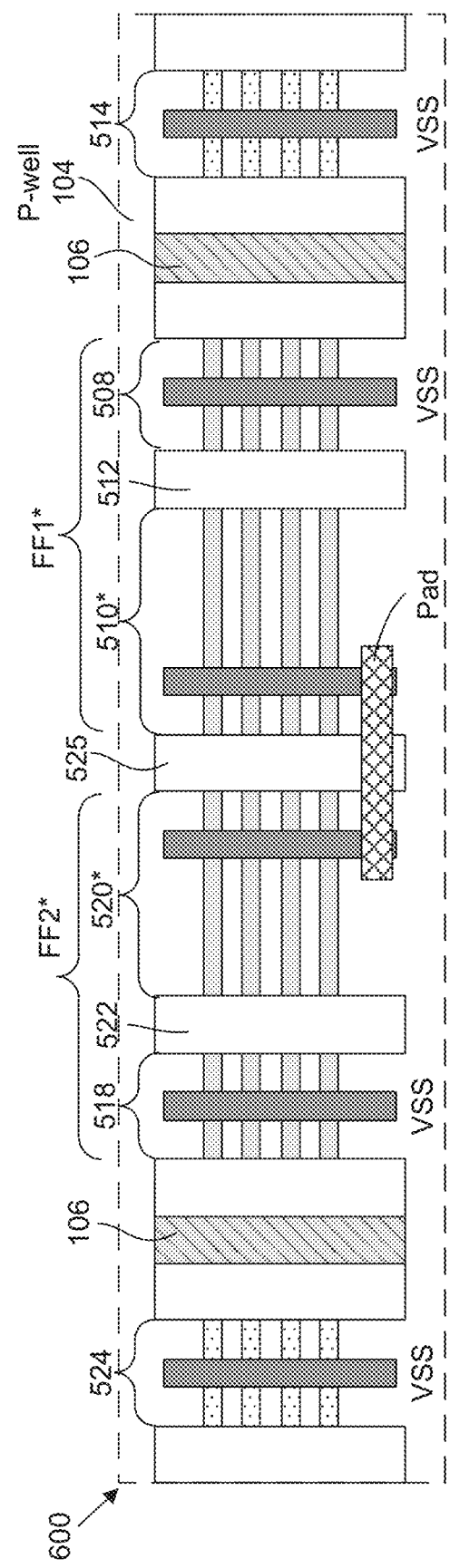

FIG. 6 is plan view of an exemplary ESD protection device 600, which may be similar to ESD protection device 500 except for the extended N+ drain regions 510* and 520* of finFETs FF1* and FF2*. Extended N+ drain regions 510* and 520* may help to reduce leakage currents during normal operation and consequently reduce power consumption, which are of significant concerns in, for example, finFET technology, or sub-micron technology nodes. However, forming extended drain regions such as 510* by forming longer drain regions compared to non-extended drain regions such as 510 (FIG. 5) increases the spacing between adjacent gates such as gates 512 and 525 beyond the poly-to-poly spacing requirement of the restrictive design rules (RDRs) in semiconductor manufacturing technology. The poly-to-poly spacing may be defined as the minimum spacing between adjacent gate structures set by RDRs. For example, the spacing between adjacent gates 512 and 525 may be referred as the poly-to-poly spacing.

Disclosed below are various embodiments of ESD protection devices with extended drain regions that meet the poly-to-poly spacing requirement of RDRs in semiconductor manufacturing technology.

Exemplary ESD Protection Device with Extended Drain Regions

Figure 7:
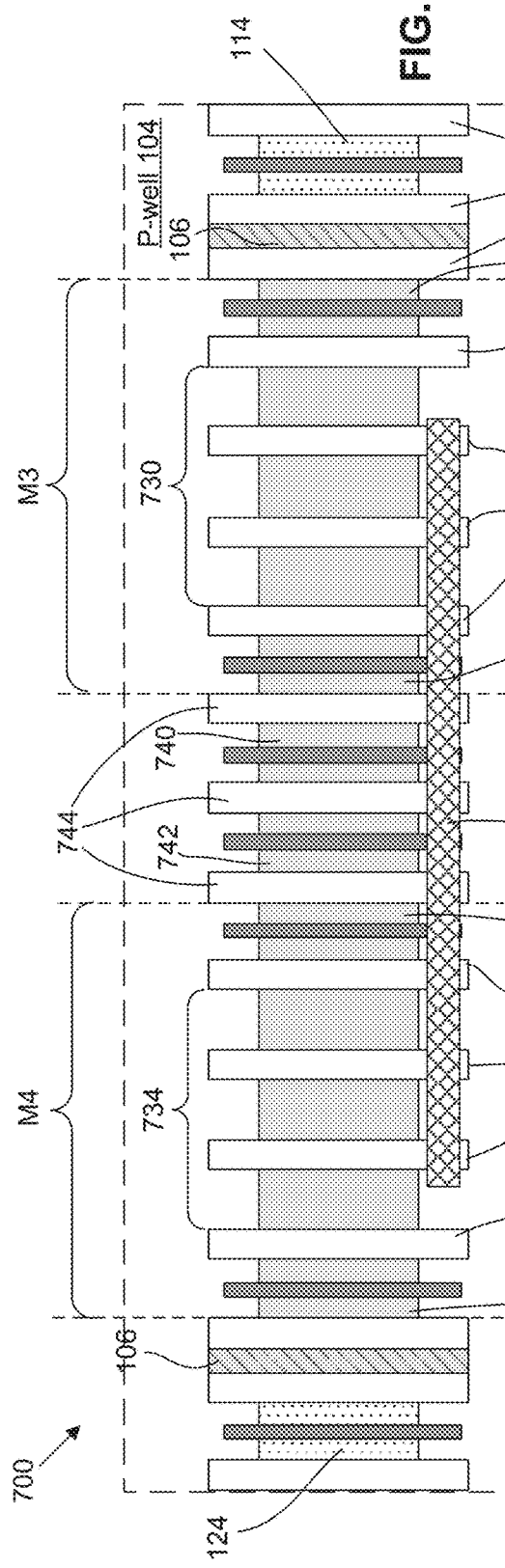
FIGS. 7-8 are plan and cross-sectional views of an exemplary drain extended NMOS based ESD protection device.
Figure 8:
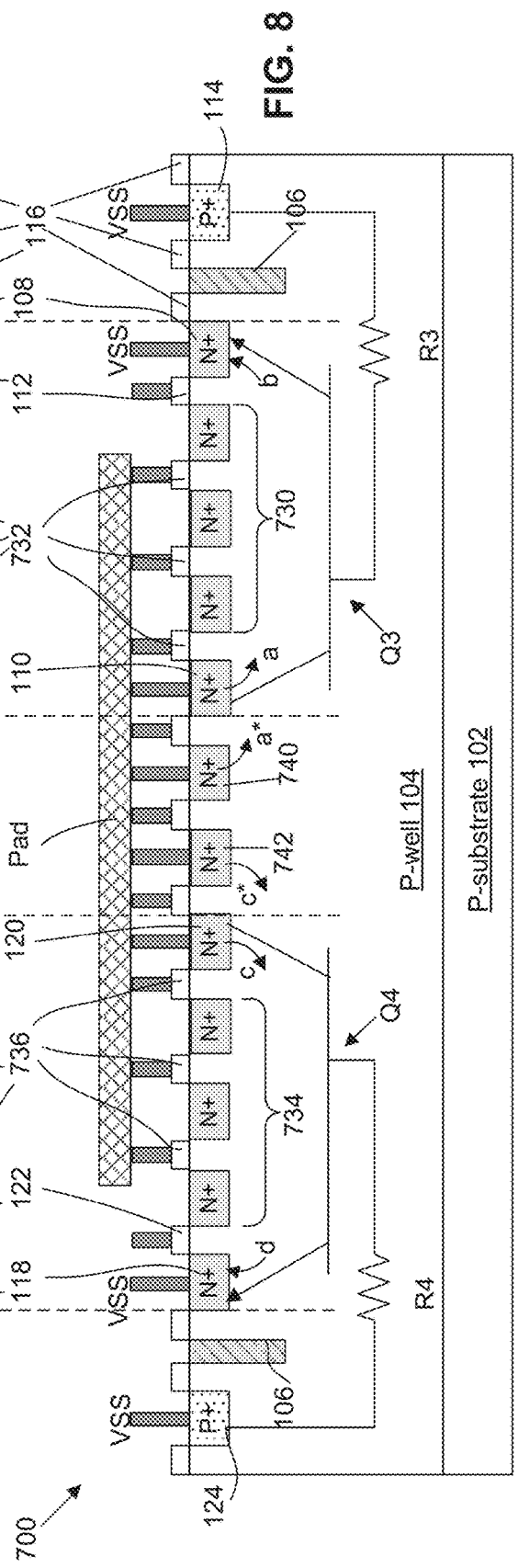

FIG. 7 is a plan view of an exemplary drain extended NMOS based ESD protection device 700 in an IC. FIG. 8 is an exemplary cross-sectional view of ESD protection device 700 of FIG. 7. ESD protection device 700 is similar to ESD protection device 100 in structure, composition, and function. The differences between ESD protection devices 100 and 700 are discussed below.

ESD protection device 700 includes drain extended NMOS transistors M3 and M4 having N+ doped regions 108, 118 configured as source regions, N+ doped regions 110 and 120 configured as drain regions, gates 112 and 122, and extended drain regions between regions 108 and 110 and between regions 118 and 120, respectively. The extended drain regions include floating N+ doped regions 730 and 734, and three gates 732 and 736 coupled to the same potential (e.g., potential of the pad) as N+ doped regions 110 and 120. The spacing between adjacent gates from among the three gates 732 and from among the three gates 736 meets the poly-to-poly spacing requirement of the RDRs.

Thus, extending drain regions 110 and 120 of transistors M3 and M4 by adding pairs of a doped region with similar doping as drain regions 110 and 120 and a gate coupled to the same potential as drain regions 110 and 120 helps to increase the drain resistances of NMOS transistors M3 and M4 while meeting the poly-to-poly spacing requirement of RDRs. Increased drain resistances may help to improve the turn-on uniformity of ESD protection device 700, which would help to turn on all discharging paths of ESD protection device 700 at the same time. Extended drain regions of transistors M3 and M4 may include one or more floating N+ doped regions 730 and 734 and one or more gates 732 and 736, respectively, and is not limited to the number of floating N+ doped regions 730 and 734 and gates 732 and 736 of FIGS. 7-8. N+ doped regions 730 and 734 may be formed in a manner similar to N+ doped region 110 and gates 732 and 736 may be formed in a manner similar to gate 112 or dummy gates 116.

ESD protection device 700 may optionally include additional N+ doped regions 740 and 742 configured as drain regions of transistor M3 and M4, respectively, and coupled to the pad. These additional drain regions 740 and 742 are spaced apart from each other and adjacent N+ doped regions by gates 744 that are coupled to same potential as drain regions 110 and 120. Gates 744 may be formed in a manner similar to gate 112 or dummy gates 116. These additional drain regions 740 and 742 provide additional discharging paths in ESD protection device 700 besides the discharging paths a and b of transistor M3 and discharging paths c and d of transistor M4. The discharge of the ESD charge current through paths a, b, c, and d are similar to that described above with reference to FIGS. 2-3. The additional discharging path of transistor M3 may be formed from N+ doped region 740 to P-well 104 (path a*) and from P-well 104 to N+ doped region 108 (path b). And, the additional discharging path of transistor M4 may be formed from N+ doped region 742 to P-well 104 (path c*) and from P-well 104 to N+ doped region 118 (path d). The additional discharging paths help to increase the volume for heat dissipation during an ESD event, and consequently, increase the discharge current handling capability of the ESD protection device. For example, an ESD protection device with one multi-drain transistor, i.e., with one additional discharging path may handle twice the current level during an ESD event than an ESD protection device without any multi-drain transistor. In another example, an ESD protection device with two multi-drain transistors, i.e., with two additional discharging paths may handle 2.5 times the current level during an ESD event than an ESD protection device without any multi-drain transistor.

Figure 9:
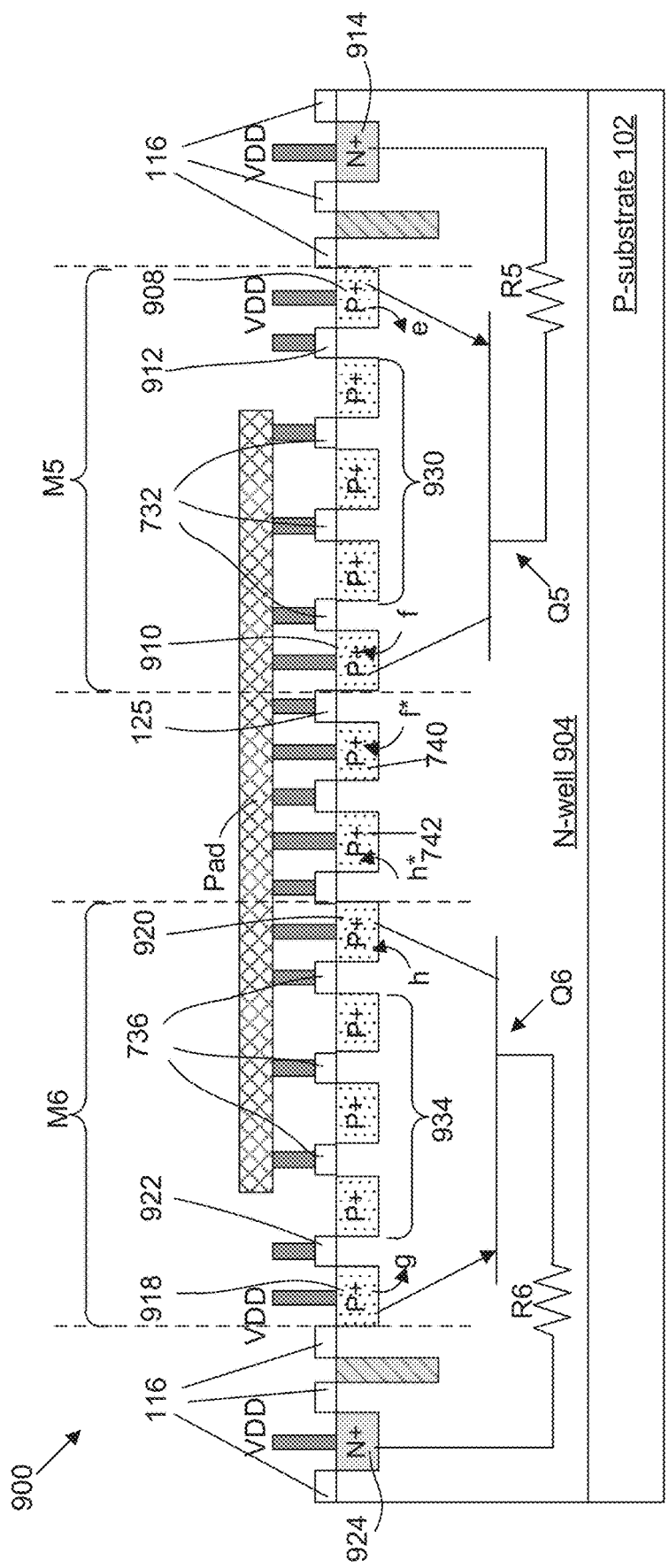
FIG. 9 is a cross-sectional view of an exemplary drain extended PMOS-based ESD protection device.

FIG. 9 is an exemplary cross-sectional view of a drain extended PMOS-based ESD protection device 900. FIG. 9 shows that ESD protection device 700 is not limited to NMOS transistors and may be implemented based on PMOS transistors M5 and M6. The differences between ESD protection devices 700 and 900 are discussed below.

ESD protection device 900 includes drain extended PMOS transistors M5 and M6 having P+ doped regions 908, 918 configured as source regions, P+ doped regions 910 and 920 configured as drain regions, gates 912 and 922, and extended drain regions between regions 908 and 910 and between regions 918 and 920, respectively. The extended drain regions include floating P+ doped regions 930 and 934, and three gates 732 and 736 coupled to the same potential (e.g., potential of the pad) as P+ doped regions 910 and 920.

Parasitic PNP transistors Q5 and Q6 are also included in ESD protection device 900. Parasitic PNP transistors Q5 and Q6 include drain regions of transistors M5 and M6 as collectors, N-well 904 formed on p-substrate 102 as bases, and source regions of transistors M5 and M6 as emitters. Bases of transistors Q5 and Q6 are coupled to the power rail VDD through N+ doped regions 914 and 924 and parasitic resistors R5 and R6, respectively. Parasitic resistors R5 and R6 represent the intrinsic resistance of N-well 904. ESD protection device 900 may operate in a manner similar to ESD protection device 700 but with reverse polarities. For example, during an ESD event, charge current through discharging paths e and f of transistor Q5 and discharging paths g and h of transistor Q6 flows in a direction opposite to that through discharging paths a and b, and discharging paths c and d, respectively. Discharging paths e and f of transistor Q5 may be formed from P+ doped region 908 to N-well 904 and from N-well 904 to P+ doped region 910. And, discharging paths g and h of transistor Q6 may be formed from P+ doped region 918 to N-well 904 and from N-well 904 to P+ doped region 920.

ESD protection device 900 may optionally include additional P+ doped regions 940 and 942 configured as drain regions of transistor M5 and M6, respectively, and coupled to the pad. Similar to ESD protection device 700, these additional drain regions provide additional discharging paths in ESD protection device 900 besides the discharging paths e and f of transistor M5 and discharging paths g and h of transistor M6. The additional discharging path of transistor M5 may be formed from P+ doped region 908 to N-well 904 (path e) and from N-well 904 to P+ doped region 940 (path f*). And, the additional discharging path of transistor M6 may be formed from P+ doped region 918 to N-well 904 (path g) and from N-well 904 to P+ doped region 942 (path h*).

Figure 10:
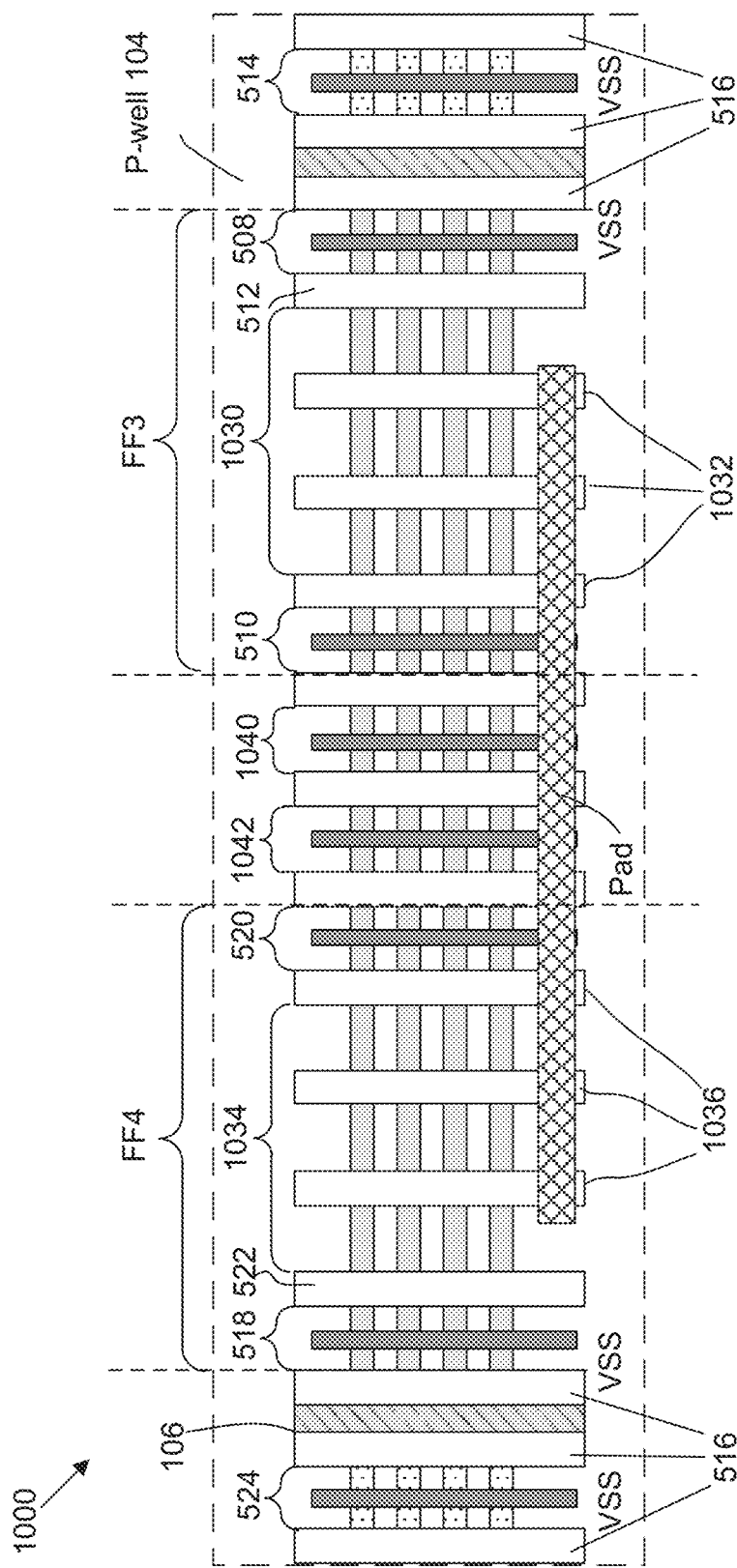
FIG. 10 is a plan view of an exemplary drain extended finFET-based ESD protection device.

FIG. 10 is a plan view of an exemplary drain extended finFET-based ESD protection device 1000 in an IC. The differences between ESD protection devices 500, 700, and 1000 are discussed below. ESD protection device 1000 is similar to ESD protection device 500, but has additional extended drain regions of FF3 and FF4 between regions 508 and 510 and between regions 518 and 520, respectively. The extended drain regions include floating N+ doped epitaxial fin regions 1030 and 1034, and gates 1032 and 1036 coupled to the same potential (e.g., potential of the pad) as N+ doped regions 510 and 520. The spacing between adjacent gates from among the three gates 1032 and from among the three gates 1036 meets the poly-to-poly spacing requirement of the RDRs. Thus, extending drain regions 510 and 520 of transistors FF3 and FF4 by adding pairs of a doped region with similar doping as drain regions 510 and 520 and a gate coupled to the same potential as drain regions 510 and 520 helps to increase the drain resistances of NMOS transistors M3 and M4 while meeting the poly-to-poly spacing requirement of RDRs. Designing drain extended finFET-based ESD protection device 1000 within the poly-to-poly spacing requirement also helps to achieve high quality epitaxial fin regions in the extended drain regions of finFET FF3 and FF4. ESD protection device 1000 is similar in material composition and function to ESD protection device 700. A person skilled in the art would understand that ESD protection device 1000 may be implemented with p-type finFET without departing from the scope of the disclosure.

ESD protection device 1000 may optionally include additional N+ doped regions 1040 and 1042 configured as drain regions of finFETs FF3 and FF4, respectively, and coupled to the pad. Similar to ESD protection device 700, these additional drain regions provide additional discharging paths in ESD protection device 1000 besides the discharging paths through finFETs FF3 (e.g., N+ doped region 510 to P-well 104 to N+ doped region 508) and FF4 (e.g., N+ doped region 520 to P-well 104 to N+ doped region 518). The additional discharging path of finFET FF3 may be formed from N+ doped region 1040 to P-well 104 and from P-well 104 to N+ doped region 508. And, the additional discharging path of finFET FF4 may be formed from N+ doped region 1042 to P-well 104 and from P-well 104 to N+ doped region 518.

Figure 13:
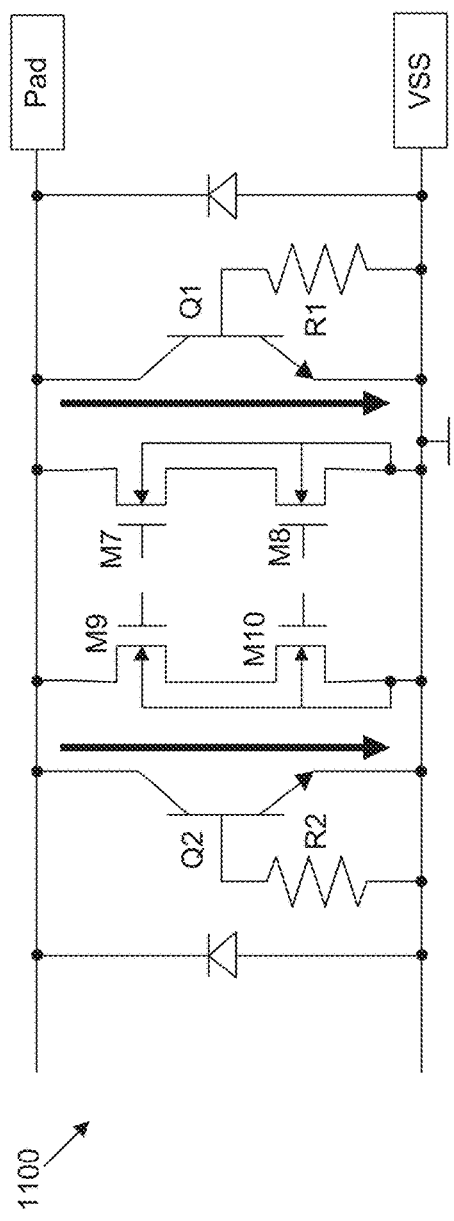
FIG. 13 is an equivalent circuit diagram of the exemplary ESD protection device of FIGS. 11-12.

FIG. 11 is a plan view of an exemplary drain extended stacked NMOS transistors based ESD protection device 1100 in an IC. FIG. 12 is an cross-sectional view of ESD protection device 1100 of FIG. 11. FIG. 13 is an exemplary equivalent circuit diagram ESD protection device 1100. The differences between ESD protection devices 700 and 1100 are discussed below. ESD protection device 1100 is similar to ESD protection device 700 in structure, composition, and function, but has additional pairs of N+ doped region 1146 and gate 1148 and N+ doped region 1150 and gate 1152. The pair of N+ doped region 1146 and gate 1148 together with source and drain regions 108 and 110 form stacked NMOS transistors M7 and M8 as shown in FIG. 13. Similarly, the pair of N+ doped region 1150 and gate 1152 together with source and drain regions 118 and 120 form stacked NMOS transistors M9 and M10 as shown in FIG. 13. N+ doped regions 1146 and 1150 and gates 1148 and 1152 may be tied to a potential. ESD protection device 1100 may include two or more transistors stacked on each other. Parasitic NPN transistors Q1 and Q2 are also included in ESD protection device 1100 between source and drain regions 108 and 110 and between 118 and 120 as in ESD protection device 700.

Figure 14:
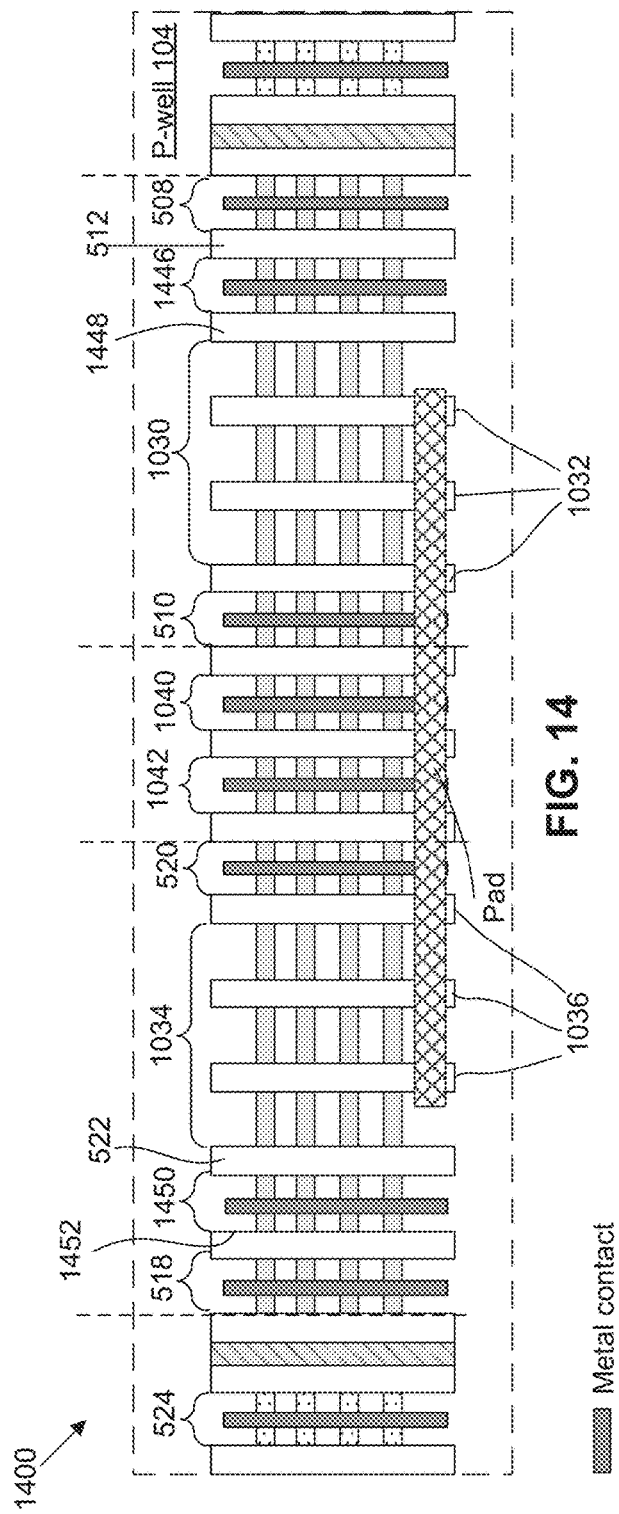
FIG. 14 is a plan view of an exemplary drain extended stacked finFET-based ESD protection device.

FIG. 14 is a plan view of an exemplary drain extended finFET-based ESD protection device 1100 in an IC. The differences between ESD protection devices 1000 and 1400 are discussed below. ESD protection device 1400 is similar to ESD protection device 1000 in structure, composition, and function, but has additional pairs of N+ doped epitaxial fin region 1446 and gate 1448 and N+ doped epitaxial fin region 1450 and gate 1452. The pair of region 1446 and gate 1448 together with source and drain regions 508 and 510 form stacked finFETs as transistors M7 and M8 in FIG. 13. Similarly, the pair of region 1450 and gate 1452 together with source and drain regions 518 and 520 form stacked finFETs as transistors M9 and M10 in FIG. 13.

FIG. 15 is a plan view of an exemplary drain extended NMOS based ESD protection device 1500 in an IC. FIG. 16 is an cross-sectional view of ESD protection device 1500 of FIG. 15. The differences between ESD protection devices 700 and 1500 are discussed below. ESD protection device 1500 is similar to ESD protection device 700, but has drain regions 110 and 120 along with the additional drain regions 740 and 742, and the extended drain regions having N+ doped regions 730 and 732 of transistors M3 and M4, respectively, formed in an N-well 1504. In some embodiments, N+ doped regions 730 and 732 are completely or partially formed within N-well 1504. That is, one or more of the N+ doped regions of regions 730 and 732 may be formed in P-well 104. In some embodiments, P-well 104 is P-substrate 102.

FIG. 17 is a plan view of an exemplary stacked NMOS transistors based ESD protection device 1700 in an IC. FIG. 18 is an cross-sectional view of ESD protection device 1700 of FIG. 17. ESD protection device 1700 is similar to ESD protection device 1100, but has drain regions 110 and 120 along with the additional drain regions 740 and 742, and the extended drain regions having N+ doped regions 730 and 732 formed in an N-well 1504. In some embodiments, N+ doped regions 730 and 732 are completely or partially formed within N-well 1504. That is, one or more of the N+ doped regions of regions 730 and 732 may be formed in P-well 104. In some embodiments, P-well 104 is P-substrate 102.

Figure 19:
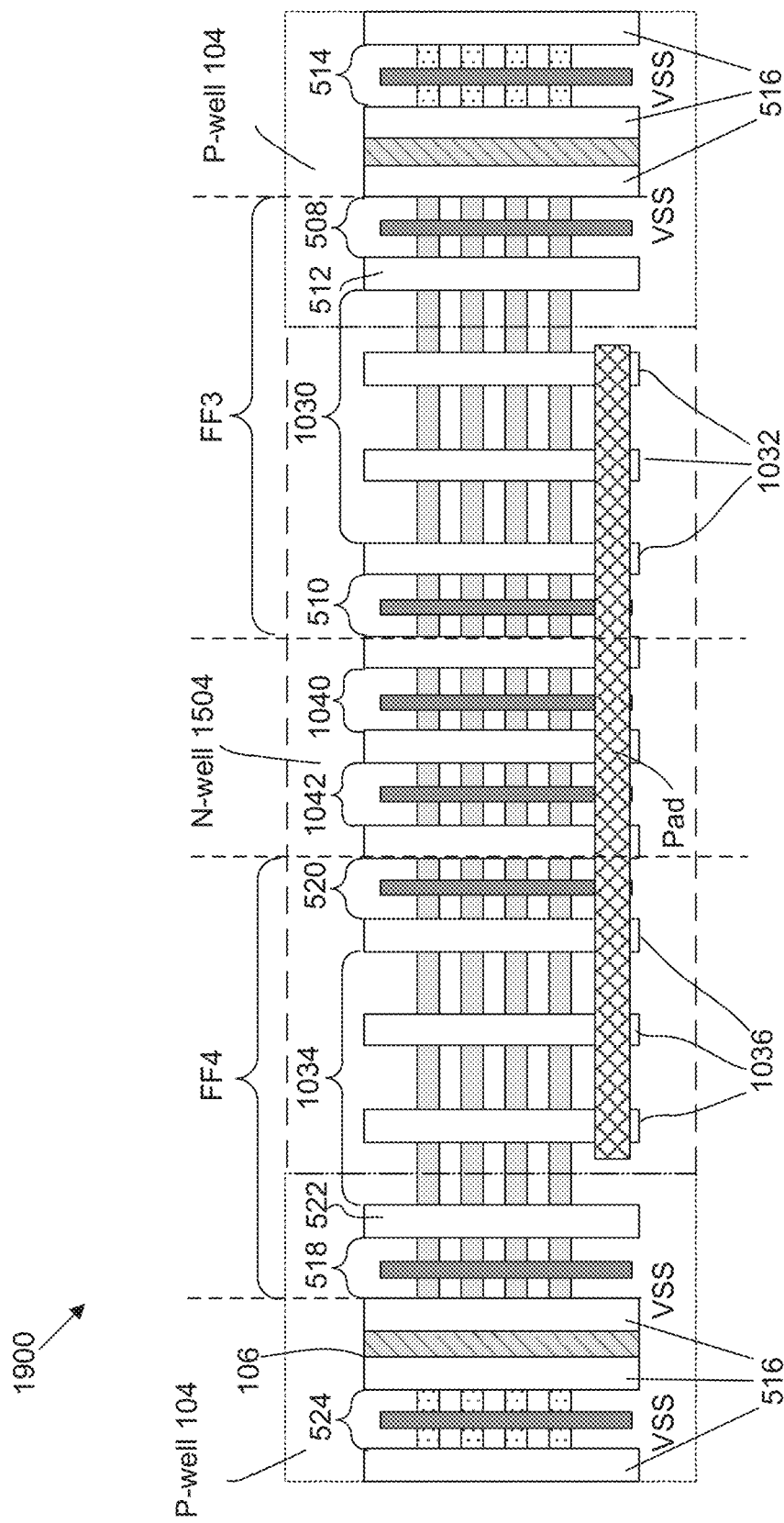
FIG. 19 is a plan view of an exemplary drain extended finFET-based ESD protection device.

FIG. 19 is a plan view of an exemplary drain extended finFET based ESD protection device 1900 in an IC. ESD protection device 1900 is similar to ESD protection device 1000, but has drain regions 510 and 520 along with the additional drain regions 1040 and 1042, and the extended drain regions having N+ doped regions 1030 and 1032 formed in an N-well 1504. In some embodiments, N+ doped regions 1030 and 1032 are completely or partially formed over N-well 1504. That is, one or more of the N+ doped regions of regions 730 and 732 may be formed over P-well 104. In some embodiments, P-well 104 is P-substrate 102.

Figure 20:
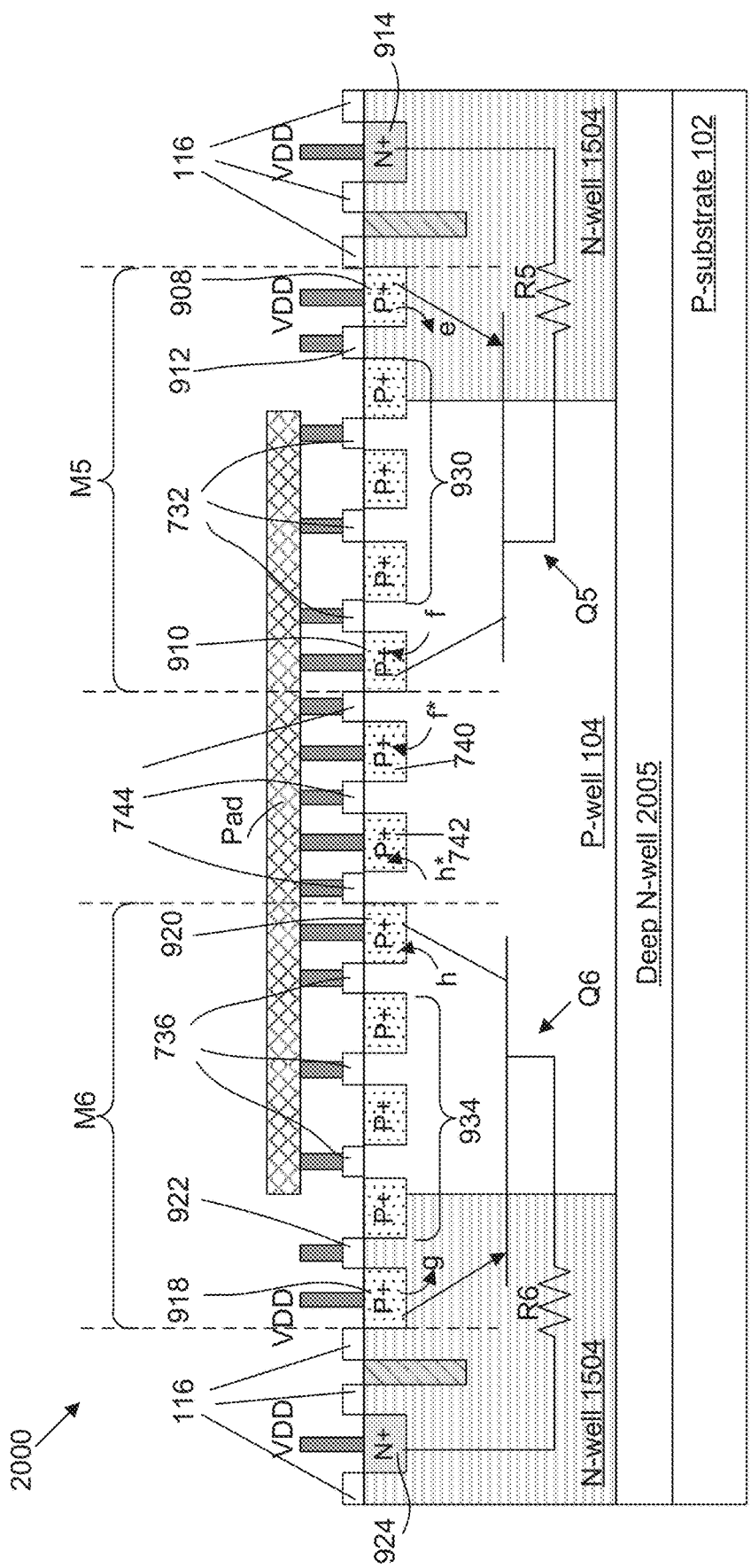
FIG. 20 is a cross-sectional view of an exemplary drain extended PMOS-based ESD protection device.

FIG. 20 is a plan view of an exemplary drain extended PMOS based ESD protection device 2000 in an IC. ESD protection device 2000 is similar to ESD protection device 900, but has a deep N-well 2005 formed on P-substrate 102. Also, drain regions 910 and 920 along with the additional drain regions 940 and 942, and the extended drain regions having P+ doped regions 930 and 934 are formed in a P-well 104 formed on deep N-well 2005. In some embodiments, P+ doped regions 930 and 934 are completely or partially formed over P-well 104. That is, one or more of the P+ doped regions of regions 930 and 934 may be formed in N-well 1504 formed on deep N-well 2005. ESD protection device 2000 also includes a deep N-well 2005 formed between P-substrate 102 and the wells 104, 1504.

The formation of the N+ doped extended drain regions of ESD protection devices 1500, 1700, and 1900 in N-well, and the formation of P+ doped extended drain regions of ESD protection device 2000 in P-well as described above may help to further increase the drain resistances, and consequently, improve the turn-on uniformity of these ESD protection devices.

Figure 21:
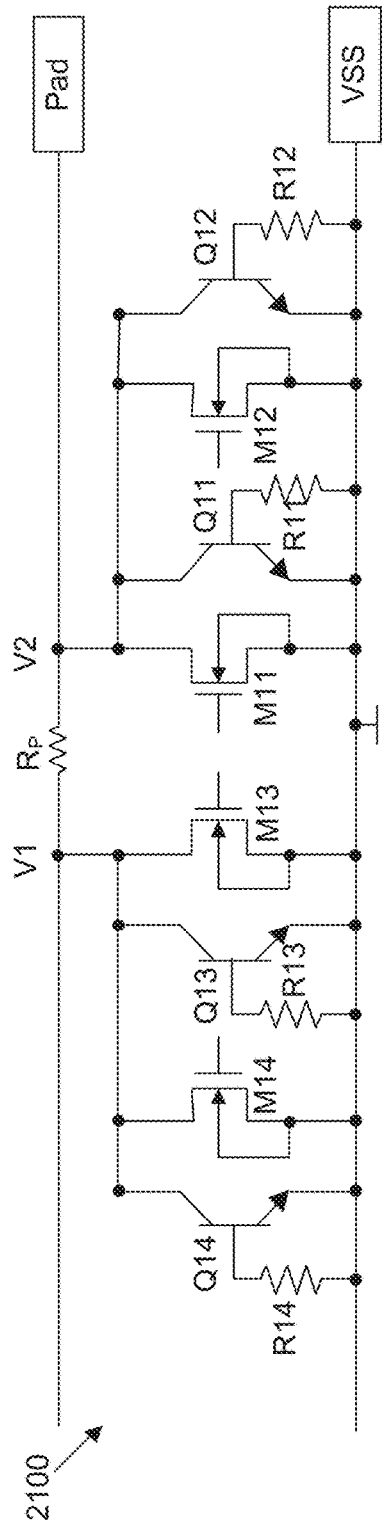
FIG. 21 is a circuit diagram of an exemplary NMOS-based ESD protection device.

FIG. 21 is an exemplary circuit diagram of an NMOS based ESD protection device 2100 that may have a structure similar to any of those described with reference to FIGS. 1-2, 5, 7-8, 10-12, and 14-19. Similar to the operation of various embodiments of ESD protection devices discussed above, during an ESD event, the ESD charge current may be discharged from the pad to the power rail VSS through one or more of the parasitic NPN transistors Q11-Q14. For efficient performance of ESD protection device 2200, it is desirable that all NPN transistors Q11-Q14 turn on at the same time. However, due to different values of parasitic resistors R11-R14 and the presence of parasitic resistance RP in metal routing from transistors M11-M14, transistors Q11-Q12 may experience a turn-on voltage V1 different from a turn-on voltage V2 that may be experienced by transistors Q13-Q14. And, if V1>V2, transistors Q13-Q14 may turn-on earlier than transistors Q11-Q12 during an ESD event and the ESD charge current may only be discharged through transistors Q13-Q14. This would result in an inefficient performance of ESD protection device 2200.

Figure 22:
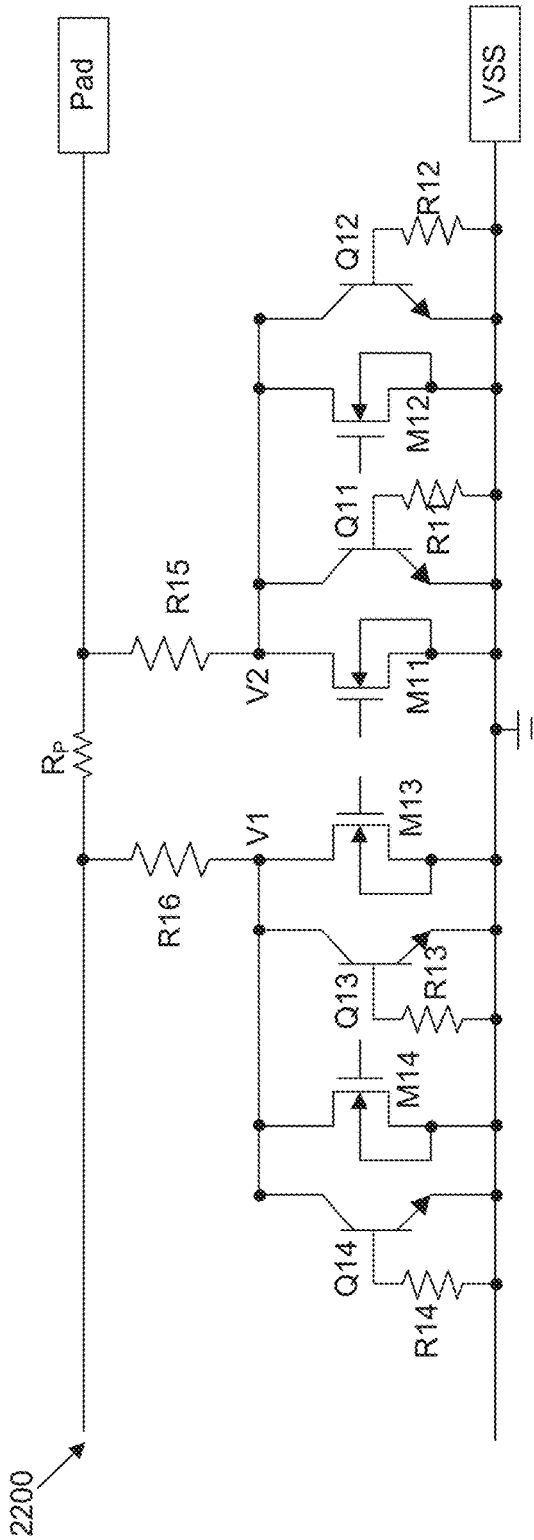
FIG. 22 is a circuit diagram of an exemplary NMOS-based ESD protection device with ballast resistors.

FIG. 22 is a circuit diagram of an exemplary NMOS based ESD protection device 2200 having ballast resistors R15-R16. Ballast resistors R15-R16 help to increase the drain resistances of transistors M11-M14 and reduce the influence of parasitic resistance RP on the turn on voltages V1 and V2, and consequently, reduce the difference between voltages V1 and V2 for turn-on uniformity.

Figure 23:
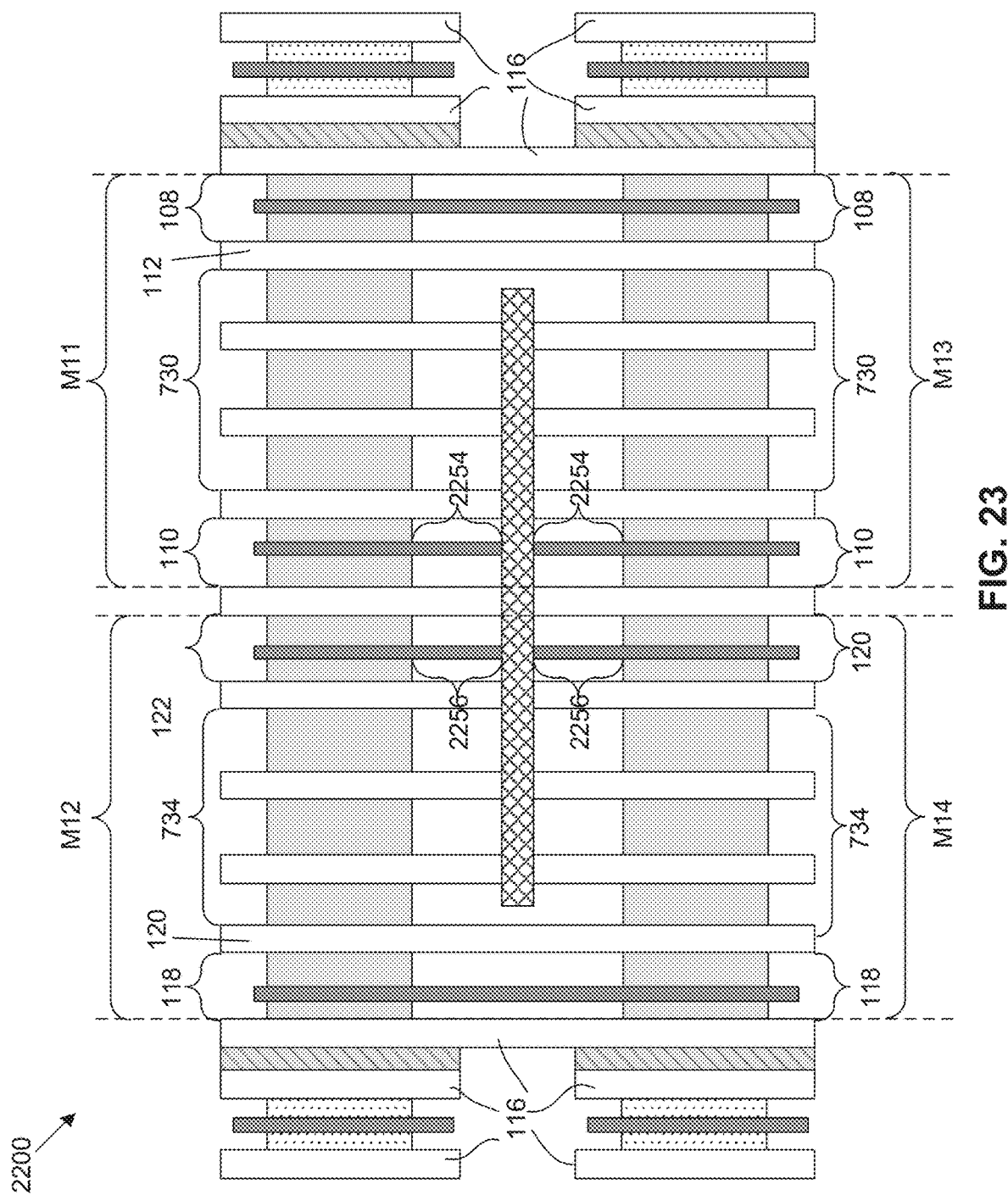
FIG. 23 is a plan view of the exemplary NMOS-based ESD protection device of FIG. 22.

FIG. 23 is a plan view of an exemplary ESD protection device 2200 of FIG. 22. ESD protection device 2200 may be implemented by repeating the structure of ESD protection device 700 and connecting them in parallel between the pad and the power rail VSS as shown in the equivalent circuit diagram of FIG. 22. Each pair of transistors M11-M12 and M13-M14 may be similar to transistors M3-M4 of ESD protection device 700. The additional drain regions 740 and 742 are not shown in ESD protection device 2200 for clarity, but these regions may be included in device 2200. The ballast resistors R15-R16 may be implemented in ESD protection device 2200 by increasing the metal routing distances (e.g., distances 2254, 2256) between drain regions 110 and 120 and the pad.

Even though ESD protection device 2200 is shown to have a structure similar to ESD protection device 700, ESD protection device 2200 may have a structure similar to any of those described with reference to FIGS. 7-8, 10-12, and 14-19. ESD protection device 2200 may also be implemented based on PMOS transistors without departing from the scope of the invention.

Example Embodiments and Benefits

In an embodiment, an ESD protection device includes a source region coupled to a first potential, a first drain region coupled to a second potential different from the first potential, and an extended drain region between the source region and the first drain region. The extended drain region includes an N number of floating doped regions and an M number of gate regions coupled to the second potential, where N and M are integers greater than 1 and N is equal to M. Each floating doped region of the N number of floating doped regions alternates with each gate region of the M number of gate regions.

In a further embodiment, an ESD protection device includes a first well region having a first type conductivity typed and a source region having a second conductivity type different from the first conductivity type. The source region is positioned within the first well region. The ESD protection device further includes a first drain region having the second conductivity type and an extended drain region having electrically floating doped regions and gate regions. A first part of the extended drain region is positioned within the first well region.

In a still further embodiment, an integrated circuit includes an I/O pad, a power rail, an ESD protection device coupled to the I/O pad and the power rail, and an ESD protected circuit connected in parallel to the ESD protection device. The ESD protection device includes a source region coupled to the power rail, a drain region coupled to the I/O pad, and an extended drain region between the source region and the drain region. The extended drain region includes electrically floating doped regions and gate regions coupled to the I/O pad. Each of the electrically floating doped regions alternates with each of the gate regions.

The foregoing disclosure outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the subjoined claims.

What is claimed is:
1. A device, comprising:
a source region coupled to a first electrical node;

a drain region coupled to a second electrical node different from the first electrical node; and an extended drain region disposed between the source and drain regions comprising electrically floating doped regions and gate regions coupled to the second electrical node, the electrically floating doped regions alternating with the gate regions, wherein at least one of electrically floating doped regions is coupled to a third electrical node, and wherein the first electrical node is connected to a first potential and the second electrical node is connected to a second potential, the second potential being different than the first potential.

2. The device of claim 1, further comprising an other source region connected to the first electrical node and positioned between the source region and the extended drain region.

3. The device of claim 1, wherein:

the source region is disposed in a first doped region; and the drain region and the extended drain region are both disposed in a second doped region.

4. The device of claim 3, wherein the first and second regions have an opposite conductivity type.

5. The device of claim 3, wherein the first doped region comprises an n-well and the second doped region comprises a p-well.

6. The device of claim 3, wherein the first doped region comprises a p-well and the second doped region comprises an n-well.

7. The device of claim 1, wherein the first electrical node is electrically connected to a ground potential and the second electric node is electrically connected to an input/output pad.

8. A protection device, comprising:

a substrate with first and second doped regions formed thereon, wherein the first and second doped regions comprise opposite conductivities;

a source region within the first doped region;

a drain region within the second doped region; and spaced apart electrically floating doped regions positioned between the source and drain regions so that an electrically floating doped region from the spaced apart electrically floating doped regions is between the first and second doped regions, wherein each spaced apart electrically floating doped region comprises a same conductivity, and wherein the source region is connected to a first potential and the drain region and electrically floating doped regions are connected to a second potential, the second potential being different than the first potential.

9. The protection device of claim 8, wherein the source region has an opposite conductivity type to the first doped region and the drain region has a same conductivity type as the second doped region.

10. The protection device of claim 8, wherein the spaced apart electrically floating doped regions have a same conductivity type as the second doped region.

11. The protection device of claim 8, further comprising an other source region between the source region and the spaced apart electrically floating doped regions.

12. The protection device of claim 11, wherein the other source region and the source region are coupled to a common electrical node.

13. The protection device of claim 12, further comprising a gate structure coupled to the common electrical node and positioned between the source region and the other source region.

14. The protection device of claim 12, further comprising a gate structure between adjacent spaced apart electrically floating doped regions.

15. The protection device of claim 14, wherein:

the source region is coupled to the first potential by the common electrical node; and the gate structure and the drain region are coupled to the second potential by a second electrical node different from the common electrical node.

16. The protection device of claim 15, wherein the first potential is a power rail and the second potential is an input/output pad.

17. An integrated circuit (IC), comprising:

an electrostatic discharge (ESD) protection device comprising:

a source region coupled to a power rail;

a drain region coupled to an input/output (I/O) pad; and a region between the source and drain regions comprising:

a gate region coupled to the I/O pad;

electrically floating doped regions; and a parasitic resistor.

18. The IC of claim 17, wherein the region between the source and drain regions is an extended drain region and the electrically floating doped regions are electrically floating drain regions.

19. The IC of claim 17, further comprising a first doped region adjacent to a second doped region, wherein:

the source region is within the first doped region; and the electrically floating doped regions and the drain region are in the second doped region.

20. The IC of claim 19, wherein the first doped region is a p-well and the second doped region is an n-well.

* * * * *